United States Patent
Fattal et al.

(10) Patent No.: US 8,492,700 B2
(45) Date of Patent: Jul. 23, 2013

(54) DYNAMIC IMPEDANCE RECEIVER CIRCUIT HAVING A FIRST AND SECOND IMPEDANCES DURING CHARGING AND DISCHARGING PHASES RESPECTIVELY FOR ULTRAFAST LOW-POWER PHOTODETECTOR

(75) Inventors: David A. Fattal, Mountain View, CA (US); Qianfan Xu, Mountain View, CA (US); Marco Fiorentino, Mountain View, CA (US); Raymond G. Beausoleil, Redmond, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 279 days.

(21) Appl. No.: 13/058,502

(22) PCT Filed: Aug. 27, 2008

(86) PCT No.: PCT/US2008/074492
§ 371 (c)(1),
(2), (4) Date: Apr. 6, 2011

(87) PCT Pub. No.: WO2010/024808
PCT Pub. Date: Mar. 4, 2010

(65) Prior Publication Data
US 2011/0186715 A1 Aug. 4, 2011

(51) Int. Cl.
*H01J 40/14* (2006.01)
(52) U.S. Cl.
USPC .................................. 250/214 R; 250/214.1

(58) Field of Classification Search
USPC .............. 250/214 R, 214.1, 214 LA, 214 A; 398/202–214, 135; 330/59, 308; 327/514
See application file for complete search history.

(56) References Cited

U.S. PATENT DOCUMENTS

| | | | |
|---|---|---|---|
| 5,311,353 A * | 5/1994 | Crawford | 359/333 |
| 6,243,505 B1 | 6/2001 | Bosso | |
| 6,542,647 B2 | 4/2003 | Minemoto | |
| 7,050,724 B1 | 5/2006 | Rantakari | |
| 2006/0182449 A1 | 8/2006 | Ianelli | |
| 2007/0086790 A1 | 4/2007 | Tai et al. | |

FOREIGN PATENT DOCUMENTS

| | | |
|---|---|---|
| JP | 1993-152862 | 6/1993 |
| JP | 1996-032525 | 2/1996 |

OTHER PUBLICATIONS

Extended European Search Report, Apr. 10, 2013, EP Application No. 08798820.0.

* cited by examiner

*Primary Examiner* — Que T Le

(57) ABSTRACT

A photodetector receiver circuit, including: a photodetector for receiving an optical signal and converting the optical signal into a current; and a dynamic impedance circuit connected to the photodetector; wherein the dynamic impedance circuit is configured to have a first impedance during a charging phase and a second impedance during a discharging phase, the first impedance comprising a slower decay time than the second impedance.

15 Claims, 4 Drawing Sheets

DYNAMIC IMPEDANCE RECEIVER CIRCUIT HAVING A FIRST AND SECOND IMPEDANCES DURING CHARGING AND DISCHARGING PHASES RESPECTIVELY FOR ULTRAFAST LOW-POWER PHOTODETECTOR

BACKGROUND

Optical communication systems are able to transmit data between two points through a light propagating in a medium. The medium may be a waveguide such as is used in fiber optic lines or intra-chip or chip-to-chip optical links. The medium may be free space, such as in free space optical communication systems, which transmit data through light from one point to another without the use of waveguides. Optical communication systems are being used more and more in high speed data transmission applications. Some of the systems require extensive infrastructure, such as fiber optic ground lines, while others require fabricated chips or minimal circuitry, such as the on-chip links or free space systems. A particular application may dictate which optical link is employed for data transmission.

Optical communication systems convert a signal from a signal to an optical signal using a transmitter circuit and send it through the medium to a receiver circuit. Such systems may use infrared light due to the ability of infrared wavelengths to be transmitted through the medium with less attenuation and dispersion than other wavelengths, though theoretically any wavelength may be used as is suitable to the medium through which the light propagates.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
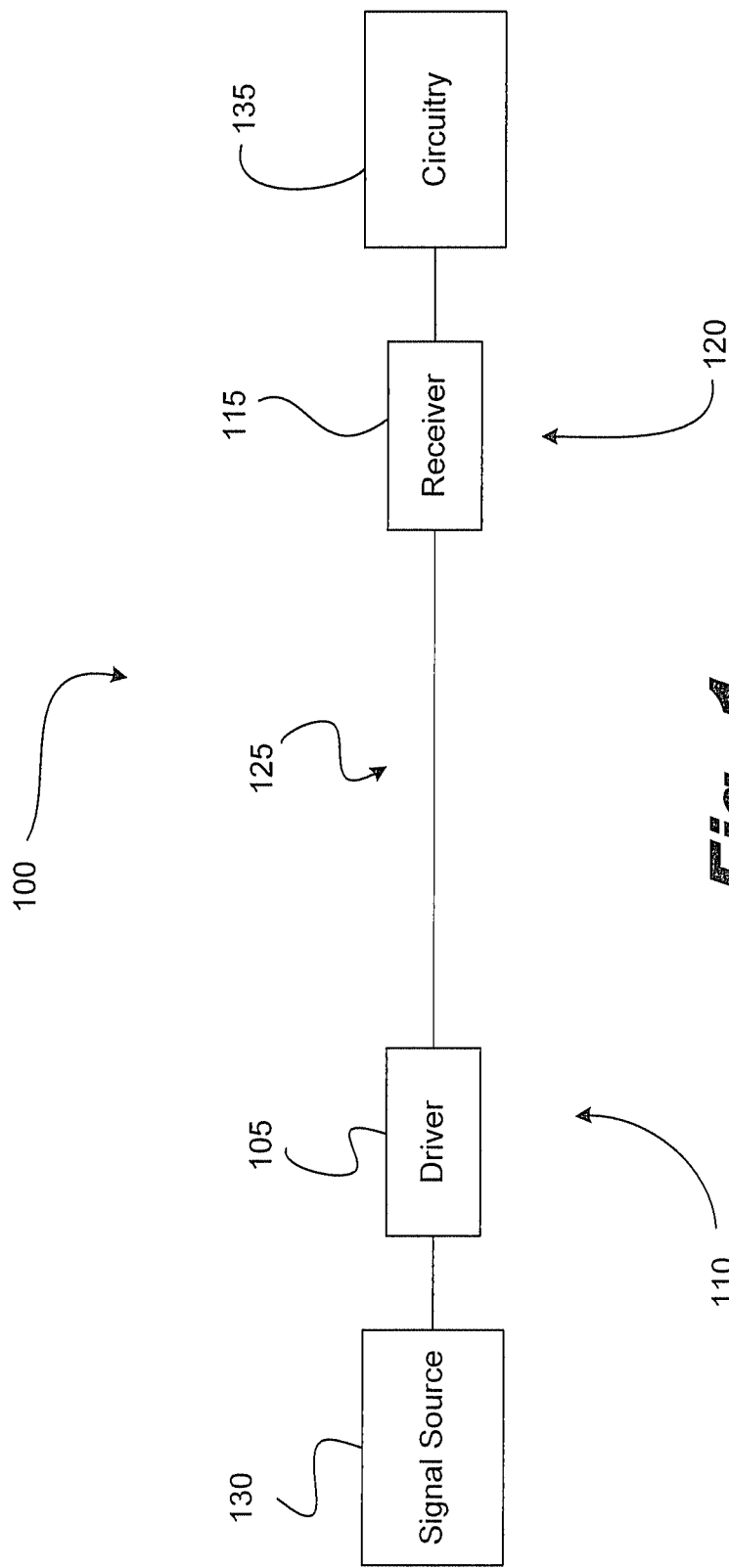
FIG. 1 is a block diagram of an optical communication link, according to an embodiment of the principles described herein.

The present specification relates to optical transmission systems, more particularly to an optical receiver circuit for minimizing power consumption while being able to receive optical transmissions at high bit rates. In various embodiments, the receiver circuit includes a photodetector for receiving an optical signal, and dynamic impedance such that the input impedance value of the circuit changes based upon a charging or discharging phase of the receiver circuit.

As used in the present specification and in the appended claims, the term "optical communication link" (optical link) refers to a system of communication that uses light propagating in a medium to transmit data between two points, generally between a transmitter or driver circuit (driver) and a receiver circuit (receiver). Such systems may be capable of transmitting data over large or short distances depending on the optical link used in a particular application. In free space optical communication systems, for example the distance and connection speed may vary depending on atmospheric conditions. Snow, rain, fog, pollution, or other conditions may interrupt the optical signal or may cause additional scattering of the photons in the optical signal, reducing the transfer bit rate. In some optical links, long distances between the driver and the receiver may result in a high amount of scattering such that the number of photons reaching the receiver is highly attenuated and requires amplification to produce a usable signal. The signal-to-noise ratio may also be too low to differentiate between the actual signal and noise which may be introduced into the system via various circuit components or atmospheric conditions.

In a particular application, an optical communication system may use infrared light to transmit data from the driver to the receiver. In another application, an optical communication link may use visible light, such as red lasers or light-emitting diodes, to transmit data from the driver to the receiver. The optical communication link may include both a driver and a receiver at both ends of the transmission path such that the optical communication link is able to communicate (transmit and receive) at both ends.

As used in the present specification and in the appended claims, the term "driver" refers to a component connected to a signal source, capable of converting a signal from the signal source into an optical signal, if needed, and transmitting the optical signal over a distance through an optical channel. The term "receiver" refers to a component capable of receiving an optical signal from the driver and converting the optical signal into another signal, generally electrical, that is usable by other components or circuitry connected to the output of the receiver.

As used in the present specification and in the appended claims, the term "photodetector" refers to a light-sensitive component that is able to convert photonic energy from an optical signal into electrical energy. Photodetectors act as a current source dependent upon the intensity of the optical signal received by the photodetector. Common photodetectors used in optical links include photodiodes. Photodiodes may be created using either a PN or a PIN junction. A PN junction has a p-type semiconductor region adjacent an n-type semiconductor region. A PIN junction is a junction that includes an intrinsic semiconductor region between the p-type and n-type regions. The p-type and n-type regions may be used for ohmic contacts. The photodetector has an associated capacitance due to the junction and is designed to be able to store a particular amount of charge from the received optical signal.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1 is a block diagram of an optical link (100). The system (100) includes a driver (105) at a first end (110) of an optical transmission channel (125) and a receiver (115) at a second end (120). The transmission channel (125) may include a free space optical signal, waveguides or optical fibers. The driver (105) is connected to a signal source (130) which produces a signal for transmission. The signal source may be an electrical source, in which case the driver (105) has the capability of converting an electrical signal to an optical signal. The electrical signal may be represented in terms of current when processed by the driver (105). The driver (105) itself may be able to convert a voltage-represented signal into a current-represented signal.

The signal source (130) may produce a data signal for transmission to the second end (120) of the optical link (100), such that the data may be processed at the second end (120). The transmitted data may be any type of data capable of being represented by an electrical current, including file transfers, streaming data, or data transfer requiring high transmission security.

In some optical links, an infrared laser diode may be powered by an electrical current, though other light-emitting devices may be used. As current flows into a laser diode, the laser diode produces an optical signal generally proportionate to the current value flowing into the laser diode. For example, a greater amount of current flowing through the laser diode produces an optical signal with a higher intensity. The driver (105) may be optimized to produce a high intensity optical output for a better signal-to-noise ratio. High intensity optical signals are able to transmit farther with lower data bit rate loss than optical outputs with lower intensity, because high intensity optical signals are more likely to have a higher concentration of photons at the center of the signal beam when the signal reaches the receiver at the second end (120). Lenses or other means may be used at both ends (110, 120) to narrow the output of the transmission channel (125) such that the least amount of scattering of the transmission channel (125) occurs and to focus the received signal on the photodetector.

The receiver (115) is aligned with the driver (105) such that the receiver (115) receives a maximum number of photons from the optical transmission channel (125). The receiver (115) then converts the transmission channel (125) into an electrical signal. The receiver (115) is also connected to additional circuitry (135) such that the received data may be processed and used. The additional circuitry may include data storage; an output medium such as a display, speakers, or a printer; processors; logic; and/or other circuitry for utilizing the transmitted data.

Figure 2:
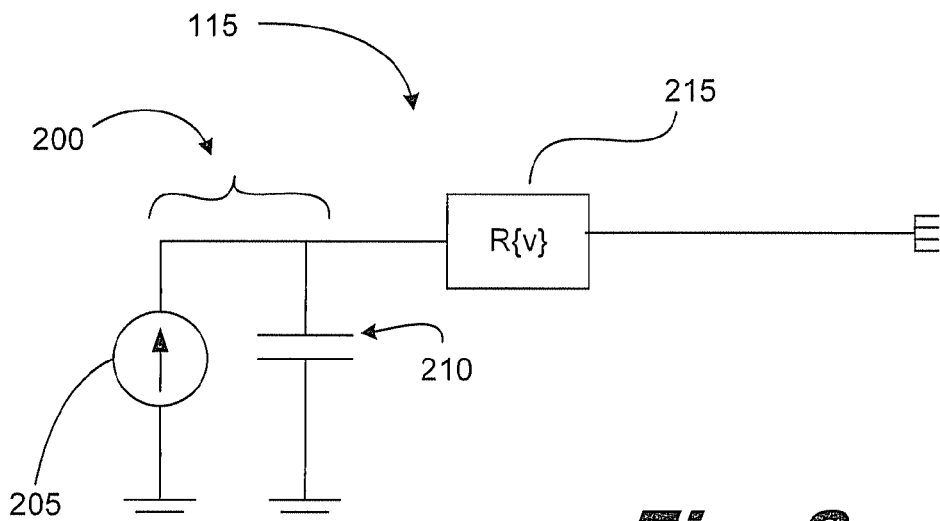
FIG. 2 is a schematic diagram of an optical receiver circuit, according to an embodiment of the principles described herein.

FIG. 2 is a simple circuit diagram of a receiver (115) to be used in accordance with the principles described in the present specification. The receiver (115) includes a photodetector (200), here represented by a current source (205) and a capacitor (210). The photodetector (200) is exposed to the photons of the optical signal, which the photodetector then converts into a current. The photodetector (200) also has an inherent capacitance associated with the size and shape of the photodetector, in addition to contact resistance of any electrical leads attached to the photodetector. The photodetector (200) may be a discrete component or it may be an integrated photodetector fabricated on a wafer with other components of the receiver (115), in addition to other circuitry.

Optical transmission channels received at the receiver are generally highly attenuated, due to scattering of light between the driver and the receiver and the distance between the driver and receiver. Some solutions of the prior art include transimpedance amplifiers used to amplify the input signal to desirable voltage/current values. However, these receivers generally either require a trade-off between allowing a large voltage buildup across the photodetector and a fast discharge of the detector capacitance, or additional power to amplify small signals. Fast receivers are essential for high speed optical applications, and the speed is dependent on the discharge speed of the detector capacitance. Many receivers of the prior art often have small, fixed input impedances adding to the need for amplification for subsequent processing. For example, a typical resistance for a receiver input impedance is 50 ohms. A very small current flowing through a 50 ohm resistor produces a very small voltage value, and is difficult to accurately process in subsequent stages. In order to resolve this problem, many traditional solutions of the prior art include several stages of amplification after the signal is received such that the signal may be properly and accurately utilized by subsequent stages of circuitry.

An advantage of the small input impedance of the receiver is that the delay time constant caused by the resistance and capacitance allows the capacitances in the photodetector to discharge quickly after receiving a pulse from the optical signal. Thus, it is advantageous to have a dynamic resistance that switches between a high input resistance when the receiver is in a charging phase and a low input resistance when the receiver is in a discharging phase. The receiver of the current embodiment has a dynamic impedance circuit (215) capable of changing resistance during operation.

The high input resistance during the charging phase produces a higher voltage value for the current produced by the photodetector than the lower input resistance, which may reduce the need for additional amplification stages. The low input impedance during the discharging phase allows the photodetector to discharge stored capacitive energy quickly, as discussed above. The speed of the receiver is highly dependent on the speed with which the photodetector capacitance is able to discharge after receiving a pulse.

Figure 3:
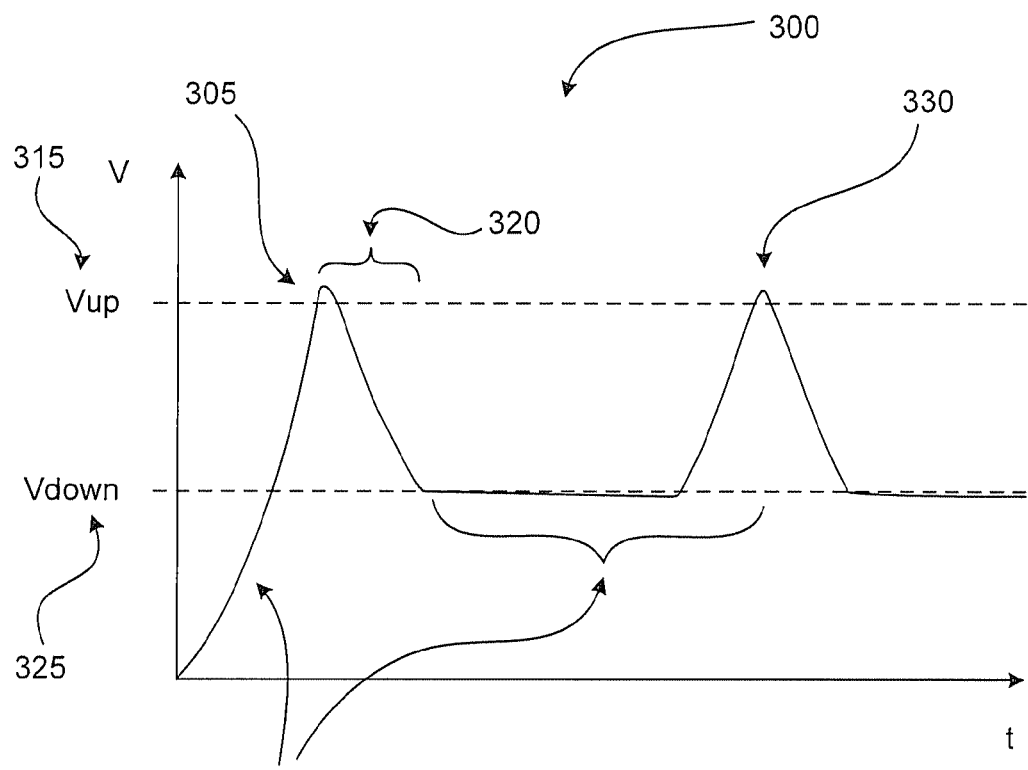
FIG. 3 is a graph of a response of an optical receiver circuit to an optical input, according to an embodiment of the principles described herein.

FIG. 3 shows a graph (300) of a photodetector response to an optical signal. The photodetector may start at a zero value initially, before any optical signal is sent to the receiver. When an optical transmission channel having multiple pulses is sent from the driver to the receiver, the photodetector voltage rises and falls accordingly as each pulse is received by the photodetector and the energy is discharged from the photodetector capacitance. The hysteresis of the receiver, based on the components in the circuit and their respective characteristics, may be designed to meet the specific needs of the particular application.

In the illustrative graph (300) shown, a first pulse (305) in the optical signal is received. When the first pulse (305) is received, the photodetector is in the charging phase (310). Once the photodetector voltage level reaches a first predetermined voltage (315), Vup, the receiver switches to a discharge phase (320) and the dynamic impedance value changes to a first, low impedance value in order to allow the charge in the detector capacitance to discharge rapidly due to a fast decay time constant. The decay time constant is calculated by multiplying the impedance of the receiver by the capacitance of the receiver. The photodetector capacitance continues to discharge rapidly until the voltage reaches a second predetermined voltage (325), Vdown, at which point the receiver switches back to a charging phase (310) and the dynamic impedance value changes to a second, high impedance value.

The high impedance value raises the decay time constant of the receiver such that the photodetector discharges the capacitative energy at a slower rate than during the discharging phase. The decay time constant caused by the high impedance value is also slow compared to that of the optical input. In the charging phase (310), whether or not a pulse is actually sent, the input impedance of the receiver may remain high as the receiver waits to receive a pulse.

When a second pulse (330) in the optical signal is received, the voltage value of the photodetector may still be at or about at the second predetermined voltage (325) due to the slow decay time caused by the high impedance value, depending on the amount of time that passes between the first and second pulses (305, 330). The receiver responds similarly to the second pulse (330) as to the first pulse. The pulse (330) is received by the photodetector and when the voltage rises to or above Vup (315), the input resistance is changed from the high resistance value to the low resistance value, allowing the energy from the pulse stored in the photodetector capacitance to discharge quickly.

Figure 4:
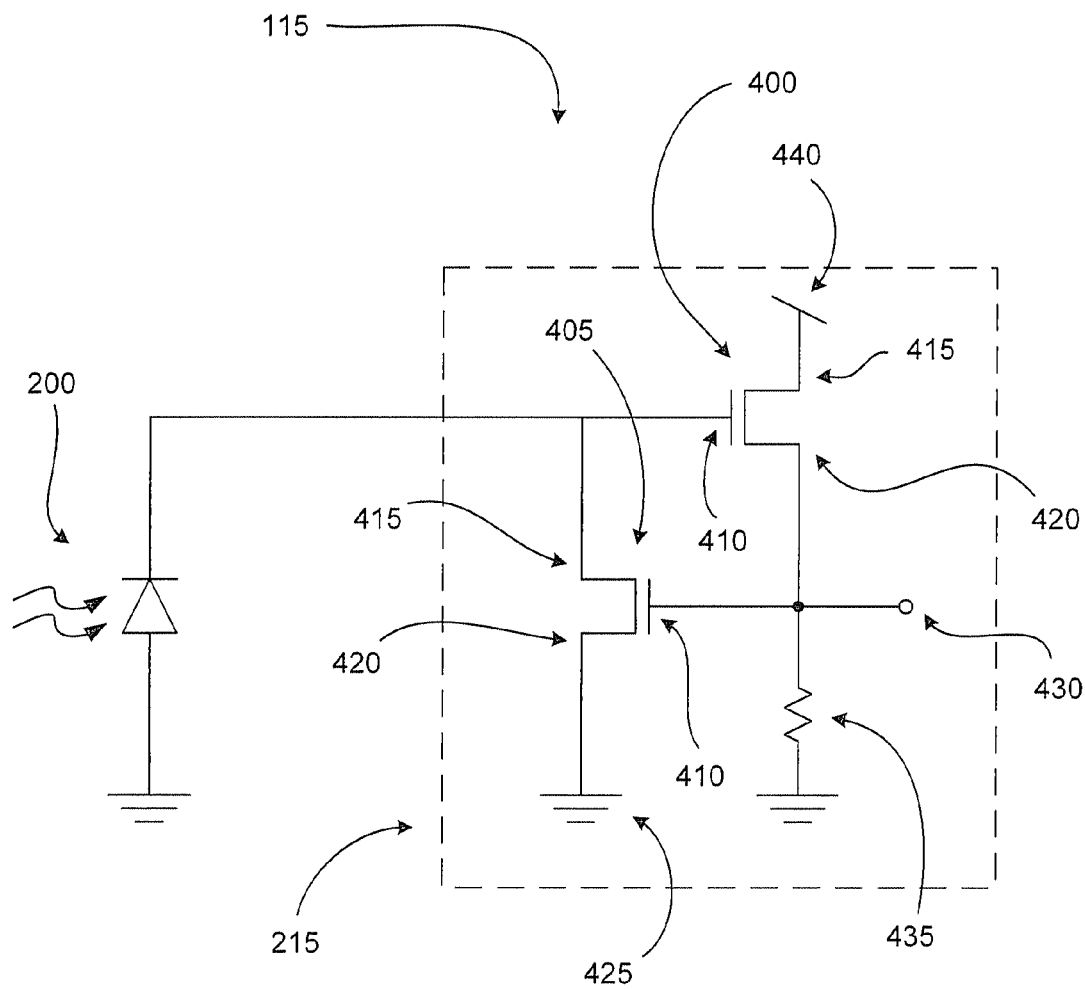
FIG. 4 is a schematic diagram of an optical receiver circuit, according to an embodiment of the principles described herein.

FIG. 4 shows a circuit diagram for a particular embodiment of a receiver (115). The receiver (115) includes a photodetector (200) for receiving the optical signal. The photodetector (200) may be a photodiode as shown in the current embodiment. The receiver (115) also includes a dynamic impedance circuit (215), which has first and second transistors (400, 405). The transistors (400, 405) may be n-channel metal oxide semiconductor field effect transistors. The photodetector (200) is connected to the gate (410) of the first transistor (400) and to the drain (415) of the second transistor (405). The source (420) of the second transistor (405) is connected to a reference point (425), or ground in this embodiment. The source (420) of the first transistor (400) is connected to the gate (410) of the second transistor (405), to the output (430), and to a resistor (435), while the drain (415) is connected to a voltage source (440).

The first transistor (400) is initially in an off position, meaning that an insufficient voltage is applied to its gate (410) to cause the first transistor (400) to allow current to flow from the voltage source (440). When the photodetector (200) receives a pulse from the optical transmission channel, the pulse is converted into an electrical signal. When the voltage value of the electrical signal from the pulse reaches the gate threshold voltage of the first transistor (400), current flows through the first transistor (400) from the voltage source (440). In this phase, the output (430) is dependent on the value of the resistor (435). The resistor (435) has a value large enough to place the output voltage at a usable value for processing or use in subsequent stages. The resistor (435) may have any value that will produce a particular desired output, and may be as large as tens to hundreds of kilohms. The dynamic impedance circuit (215) may also include several resistors in parallel and/or in series, or may include a variable potentiometer such that the desired resistance value may be achieved.

When the voltage value at the output (430), where the source (420) of the first transistor (400) is connected to the gate (410) of the second transistor (405), reaches the gate threshold voltage of the second transistor (405), the second transistor (405) turns on and current from the photodetector (200) is diverted through the second transistor (405) and the photodetector (200) begins to discharge. The speed at which the photodetector discharges largely determines the speed of the receiver.

The transistors (400, 405) are selected such that each has a specific, known gate threshold voltage. The threshold voltage of each transistor is an important part in determining the points at which the receiver switches from a high input impedance to a low input impedance, and vice versa. Other characteristics of the transistors may also affect the operation of the circuit, such as the resistance seen at the input, or the inherent transistive capacitance. The capacitance of the transistors has an effect on the decay time constants of the receiver. The receiver of the present specification may reduce the overall capacitance of the circuit from solutions of the prior art that include transimpedance amplifiers by potentially reducing stray capacitance. The current embodiment has a simple design that may introduce a minimal amount of capacitance to the receiver. Each of the transistors may have transistive capacitances of approximately 10 femtofarads, though the transistors may have other capacitances depending on the type of transistors chosen for a particular embodiment of the present specification. The delay time constants due to both the high and the low input impedances are ideally both smaller than 100 picoseconds such that the receiver may operate at a speed of up to 10 gigabits per second or higher.

Due to the receiver's ability to receive a pulse at a high input impedance, the output (430) of the receiver (115) may be as large as 100 mV or as large as 1V or higher. The output voltage may depend on the value of the resistor (435) at the output, in addition to the voltage of the voltage source (440). The receiver may or may not be followed by additional amplification stages, though the ability of the receiver in the present specification to output higher voltages may eliminate the need for any other amplification stages. The signal-to-noise ratio of the output may also be adequate to meet the needs of further processing or usage. The power consumption of the receiver circuit (not including the power received from the optical signal) may be as low as less than 1 femtoJoule per bit. This is advantageous because the receiver of the present specification is a very low power solution for data transfer over a distance and may also be less costly than other solutions of the prior art.

Figure 5:
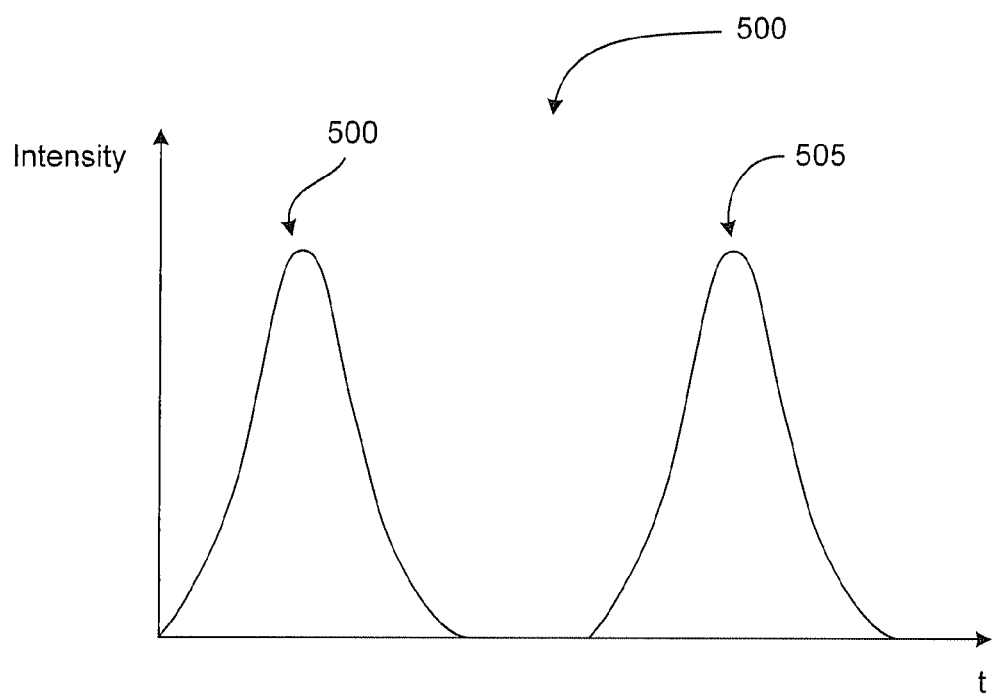
FIG. 5 is a graph of a number of pulses in an optical signal, according to an embodiment of the principles described herein.
Figure 6:
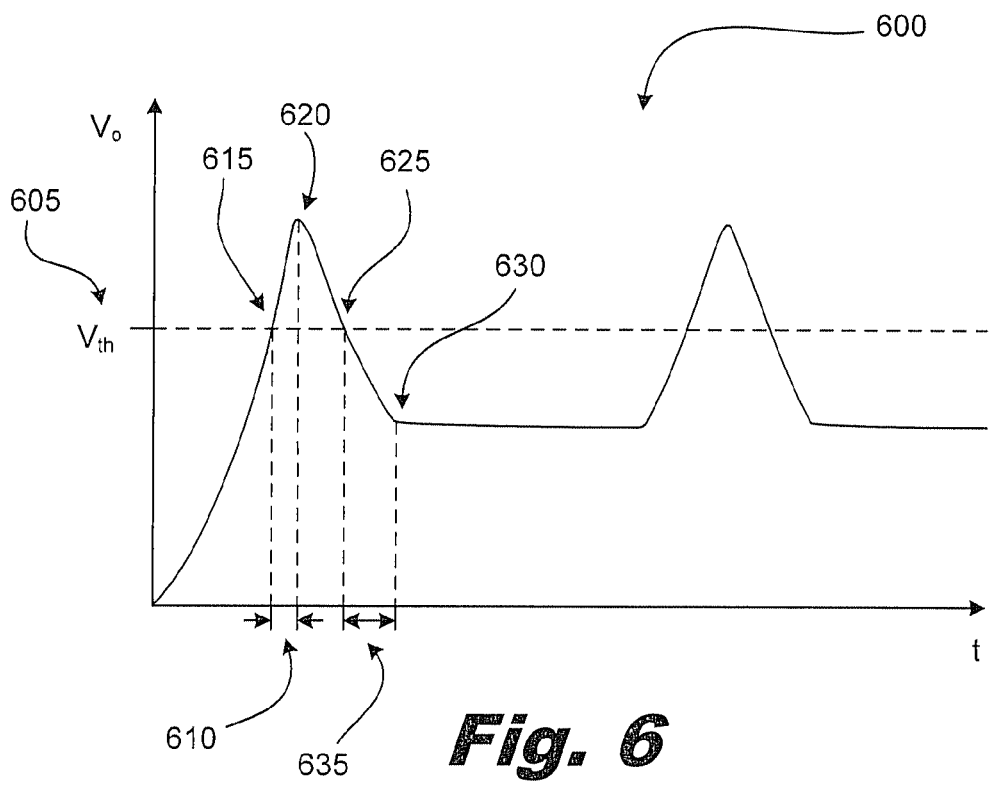
FIG. 6 is a graph of a response of an optical receiver circuit to an optical input, according to an embodiment of the principles described herein.

FIG. 5 shows a graph (500) of a number of pulses (500, 505) of an optical transmission channel, and FIG. 6 is a graph (600) of a possible response for a particular receiver circuit according to the present specification. The response of the receiver may be configured to work with delays based on the several components of the circuit. For example, as a first pulse (500) is input into the receiver, the voltage at the first transistor may reach a sufficient value to turn the first transistor on such that current flows through the first transistor and a voltage is produced at the output node. When the voltage at the output node reaches the threshold voltage (605) of the gate of the second transistor, the second transistor turns on and begins conducting current and allows the charge in the photodetector to be released. However, there may be a delay (610) between the time (615) that the threshold voltage (605) is reached and the time (620) that the transistor actually begins conducting current so that the voltage stored by the photodetector starts discharging, as shown in FIG. 6. The circuit may be designed with this delay (610) in order to produce a specific output voltage which may be higher than the threshold voltage (605) of the second transistor.

As current flows through the second transistor, the charge from the photodetector capacitance is released and the voltage at the gate of the first transistor drops, eventually to the point that the first transistor no longer conducts enough current to produce an output voltage at the level of the threshold voltage of the second transistor. The second transistor then stops conducting current and the decay time constant becomes large, due to the resistor at the output. There may be a delay (635) between the time (625) that the output voltage drops below the threshold voltage (605) of the second transistor and the time (630) that the second transistor actually stops conducting current. This may cause the output voltage to be lower than the threshold voltage (605) of the second transistor when the decay time constant becomes slow, as shown in the graph (600). The same principles apply when a second pulse (505) is received.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A photodetector receiver circuit, comprising:
a photodetector for receiving an optical signal and converting said optical signal into a current; and
a dynamic impedance circuit connected to said photodetector;
wherein said dynamic impedance circuit is configured to have a first impedance during a charging phase and a second impedance during a discharging phase, said first impedance comprising a slower decay time than said second impedance.

2. The photodetector receiver circuit of claim 1, wherein said discharging phase begins after a charge build-up across said photodetector rises to an upper voltage.

3. The photodetector receiver circuit of claim 2, wherein said dynamic impedance circuit comprises a transistor configured to draw current from said photodetector at said second impedance when a charge buildup across said photodetector reaches said upper voltage.

4. The photodetector receiver circuit of claim 1, wherein said charging phase begins after a charge build-up across said photodetector drops to a lower voltage.

5. The photodetector receiver circuit of claim 1, wherein a respective decay time of said charging phase is slower than a response of said photodetector to said optical transmission.

6. The photodetector receiver circuit of claim 1, wherein said charging and discharging phases are based on a hysteresis of said photodetector receiver circuit.

7. The photodetector receiver circuit of claim 1, wherein said second input impedance is approximately 50 ohms.

8. The photodetector receiver circuit of claim 1, wherein said first input impedance is greater than 1 kilohm.

9. The photodetector receiver circuit of claim 1, wherein said decay time constants due to said first and second input impedances are faster than 100 picoseconds.

10. A method for receiving an optical signal using a photodetector receiver circuit, comprising:
receiving said optical signal using a photodetector;
converting said optical signal into a electrical signal having a current; and
varying an impedance of said receiver circuit when a pulse from said optical signal is received, such that said receiver circuit comprises a first input impedance during a charging phase and a second input impedance during a discharging phase,
the second input impedance comprising a faster decay time than said first input impedance.

11. The method of claim 10, wherein said discharging phase begins after a charge build-up across said photodetector rises to an upper voltage.

12. The method of claim 11, further comprising discharging said photodetector through a transistor at said first input impedance during said discharging phase.

13. The method of claim 10, wherein said charging phase begins after a charge build-up across said photodetector drops to a lower voltage.

14. The method of claim 13, wherein said receiver circuit comprises a large decay time constant during said charging phase due to said first input impedance, said large decay time constant being slower than said pulse from said optical signal.

15. The method of claim 10, wherein a respective decay time of said charging phase is slower than a response of said photodetector to said optical signal.

* * * * *